United States Patent [19]

Mueller et al.

[11] Patent Number: 4,803,147
[45] Date of Patent: Feb. 7, 1989

[54] PHOTOSENSITIVE POLYIMIDE POLYMER COMPOSITIONS

[75] Inventors: Werner H. Mueller, E. Greenwich; Dinesh N. Khanna; Rohitkumar H. Vora, both of W. Warwick, all of R.I.

[73] Assignee: Hoechst Celanese Corporation, Somerville, N.J.

[21] Appl. No.: 124,742

[22] Filed: Nov. 24, 1987

[51] Int. Cl.$^4$ ................................................ G03C 1/68
[52] U.S. Cl. ...................................... 430/288; 430/271; 430/285; 430/906; 522/142; 522/164
[58] Field of Search ................. 522/164, 142; 430/283, 430/288, 906, 905, 285, 281, 271

[56] References Cited

U.S. PATENT DOCUMENTS

| Re. 30,186 | 8/1980 | Rubner et al. | 430/325 |
|---|---|---|---|
| 3,310,573 | 3/1967 | Coe | 260/346.3 |
| 3,356,648 | 12/1967 | Rogers | 260/47 |
| 3,959,350 | 5/1976 | Rogers | 260/47 C |
| 4,416,973 | 11/1983 | Goff | 522/164 X |
| 4,430,418 | 2/1984 | Goff | 522/164 X |
| 4,558,117 | 10/1985 | Nakano et al. | 430/283 X |
| 4,565,767 | 1/1986 | Kataoka et al. | 430/196 |
| 4,629,777 | 12/1986 | Pfeifer | 522/164 X |
| 4,677,186 | 6/1987 | Pfiefer | 528/220 |
| 4,698,295 | 10/1987 | Pfeifer et al. | 430/325 |

Primary Examiner—Paul R. Michl
Assistant Examiner—Cynthia Hamilton
Attorney, Agent, or Firm—Perman & Green

[57] ABSTRACT

A photosensitive polyimide polymer composition comprising a solvent soluble polyimide condensation product of an aromatic dianhydride and an aromatic diamine, a polyfunctional ethylenically unsaturated monomer and a photoinitiator. The solvent soluble polyimides of the composition are prepared from at least one compound selected from 2,2-hexafluoro-bis-(3,4-dicarboxyphenyl)tetracarboxylic dianhydride; 1,1-bis-[4-(1,2-dicarboxyphenyl)]-1-phenyl-2,2,2-trifluoroethane dianhydride; 2,2-hexafluoro-bis(3-aminophenyl)propane; 2,2-hexafluoro-bis(4-aminophenyl)propane; 2,2-hexafluoro-bis-[4-(3-aminophenoxy)phenyl]propane; 2,2-hexafluoro-bis-[4-(4-aminophenoxy)phenyl]propane and 1,1-bis-(4-aminopheny)-1-phenyl-2,2,2-trifluoroethane or mixtures thereof.

16 Claims, No Drawings

PHOTOSENSITIVE POLYIMIDE POLYMER COMPOSITIONS

BACKGROUND OF THE INVENTION

Aromatic polyimides possess physical properties which makes them particularly useful in microelectronic applications. The properties include high thermal stability, high insulating properties - low dielectric constant, excellent adhesion to substrates, high radiation stability, excellent planarization and high flexibility in comparison to inorganic dielectrics. Various efforts to utilitize polyimides in microelectronic applications are reported in the literature which can be generally classified as complicated and not entirely satisfactory.

Rubner et al, U.S. Pat. No. Re. 30,186 discloses a method of preparing a negative photoresist by preparing a mixed diester - diacid chloride of pyromellitic dianhydride containing an ethylenically unsaturated group in the ester portion. This derivative is then reacted with an aromatic diamine to yield a poly(amide-ester) which is mixed with a photoinitiator and solvent to form a resist solution which is coated on a substrate, exposed and developed in the conventional manner. After development the relief structure is heated to drive off the crosslinked ester portion and form the polyimide. The procedure is complicated; requiring long, low temperature reaction times in excess of a day just to form the poly(amide-ester) precursor.

U.S. Pat. No. 4,565,767 discloses a light sensitive composition consisting of an aromatic polyamic acid, a bisazide and an ethylenically unsaturated tertiary amine. The storage stability of polyamic acid precurssor is known to be poor.

U.S. Pat. No. 4,677,186 discloses a light sensitive polymer from an aminodicarboxylic acid. This polymer is light sensitive and crosslinkable by radiation to form a negative resist.

EP No. 141,781 discloses a negative photoresist consisting of a polymethyl substituted, solvent soluble polyimide and a diazide which is crosslinkable by imagewise exposure to actinic radiation in the exposed area and developed by conventional solvent techniques. The methyl substituent of this polyimide provide for its solubility but they give rise to poor oxidative thermal stability.

The literature takes the general approach of preparing light sensitive negative photoresists from either a polyamic acid, polyimides with a high percentage of lower alkyl ring substituents or a photosensitive polymer. These approaches involve complicated synthesis methods and the polyamic acid based compositions have storage stability problems. It is the object of this invention to provide negative photoresist compositions by simplified and cost efficient procedures that possess good storage stability and good photoresist properties.

The photosensitive polyimide compositions of the invention can have additional applications in other areas; for example in the production of laminating varnishes for the manufacture of high temperature laminates or composites; the manufacture of formed or molded parts having a defined physical shape or in other electronic applications such as liquid crystal displays. These applications and others will be readily apparent to the worker of ordinary skill in light of the foregoing disclosure.

SUMMARY OF THE INVENTION

This invention is that of a new photosensitive polymer composition useful as a negative photoresist which may be processed by conventional techniques to provide a thermally stable relief pattern in the exposed areas. The resulting relief pattern in addition to high thermal stability provides sharp definition and excellent mechanical, chemical and electric properties which are highly desired in electronic applications.

The photosensitive compositions of the invention comprise a mixture of a solvent soluble aromatic polyimide of an aromatic dianhydride and an aromatic primary diamine, a photoinitiator and a photopolymerizable compound containing at least two terminal ethylenically unsaturated groups.

The solvent soluble polyimides of the invention are the condensation products of an aromatic dianhydride and a primary aromatic diamine wherein at least one of said dianhydride or diamine is selected from 2,2-hexafluoro-bis(3,4-dicarboxyphenyl)propane dianhydride; 2,2-hexafluoro-bis(3-aminophenyl)propane; 2,2-hexafluoro-bis-(4-aminophenyl)propane; 2,2-hexafluorobis-[4-(3-aminophenoxy)phenyl]propane; 2,2-hexafluoro-bis-[4-(4-aminophenoxy)phenyl]propane; 1,1-bis(4-aminophenyl)-1-phenyl-2,2,2-trifluoroethane; 1,1-bis-[4-(1,2-dicarboxyphenyl)]-1-phenyl-2,2,2-trifluoroethane dianhydride and mixtures thereof.

DESCRIPTION OF THE PREFERRED EMBODIMENTS

The photosensitive compositions of the invention are useful in many applications such as photopolymerizable varnishes or protective layers such as passivation overcoat films, planarization layers in microelectronic circuits, insulating layers for multi layered hybrid circuits and as photoresists that provide relief structures of good definition on substrates such as silicon chips, polymeric films and metal plates.

The photosensitive compositions of the invention provide polymeric layers or relief structures that possess high thermal and radiation stability, excellent mechanical properties and high insulating properties. These properties make the photosensitive compositions of the invention particularly suited for microelectronic circuit applications. Insulating and mechanical properties are of importance in electronic application to provide for high density circuitry devices that are structurally sound. Thermal and radiation stability are required to withstand the high temperature and radiation environments of modern manufacturing techniques used in the electronic industry. In other applications such as printing plates, the tough mechanical properties of the photopolymerizable compositions of the invention provide a means to make printing plates having the capability of giving long printing runs. In addition, the highly solvent soluble compositions provide the capability of making thick films.

The photosensitive compositions of the invention comprise a mixture of a solvent soluble, aromatic polyimide of an aromatic dianhydride and an aromatic primary diamine, a photoinitiator and a photopolymerizable compound containing at least two terminal ethylenically unsaturated groups.

The solvent soluble polyimide of the invention are the condensation products of an aromatic dianhydride and a primary aromatic diamine wherein at least one of said dianhydride or diamine is selected from 2,2-hexafluoro-bis(3,4-dicarboxyphenyl)propane dianhydride; 2,2-hexafluoro-bis(3-aminophenyl)propane; 2,2-hexafluoro-bis-(4-aminophenyl)propane; 2,2-hexafluoro-bis[4-(3-aminophenoxy)phenyl]propane; 2,2-hexafluoro-bis[4-aminophenoxy)phenyl]propane; 1,1-bis(4-aminophenyl)-1-phenyl-2,2,2-trifluoroethane; 1,1-bis-[4-(1,2-dicarboxyphenyl)]1-phenyl-2,2,2-trifluoroethane dianhydride and mixtures thereof.

The preparation of the dianhydrides and diamines useful in the preparation of the solvent soluble polyimide component of the photosensitive compositions of invention are known in the art; see e.g., U.S. Pat. No. 3,310,573, Veber, W. B.; Gupta, M. R., Recent Advances in Polyimide Science and Technology, Second International Conference on Polyimides; Chemistry, Characterization and Applications; Society of Plastics Engineers Inc., Poughkeepsie, N.Y. (1986) and Lau et al, Journal of Poly. Science, Poly. Chem. Ed., Vol. 20, p. 2381-2393 (1982). The preparation of the solvent soluble polyimides of the invention is also known; see e.g., U.S. Pat. No. 3,356,648, column, in 55-70, columns 3, 4 and 5 and U.S. Pat. No. 3,959,350. The teachings of the literature references of this paragraph are hereby incorporated by reference.

The solvent soluble polyimides useful in the preparation of the photosensitive compositions of the invention are represented by the following general formulae:

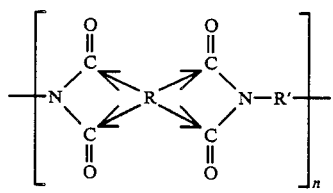

wherein R is a tetravalent aromatic moiety, the bond sign→denotes isomerism, R' is a divalent aromatic moiety and n is a number sufficient to provide an inherent viscosity of at least 0.2 as measured from a solution of the polymer in dimethylacetamide at 25° C. at a polymer concentration of 0.5 weight percent. In order to achieve the desired solubility, thermal and radiation stability, electrical insulating and mechanical properties at least one of the moieties R or R' or both is selected respectively from a tetravalent or divalent moiety of the formula:

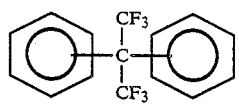

or

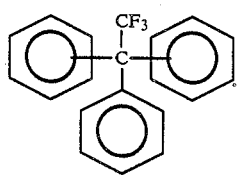

When the moiety R comprises the hexafluoroisopropylidene group or the 1-phenyl-2,2,2-trifluoroethylidene group, the moiety R' is selected from:

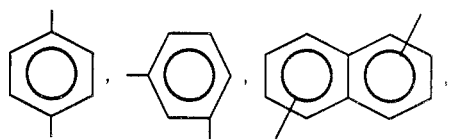

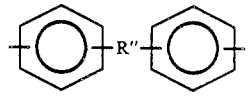

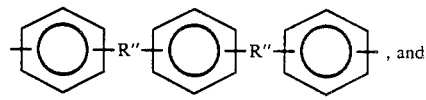

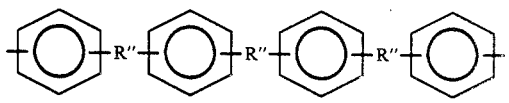

wherein R" is a divalent moiety independently selected from a covalent carbon to carbon bond, methylene, ethylene, propylene, isopropylene, hexafluoroisopropylidene, 1-phenyl-2,2,2-trifluoroethylidene, dichloro and difluoroalkylenes up to 3 carbons, oxy, thio, sulfinyl, sulfonyl, sulfonamido, carbonyl, oxydicarbonyl, oxydimethylene, sulfonyldioxy, carbonyldioxy, disilanylene, polysilanylene up to 8 Si atoms; disiloxanylene, and a polysiloxanylene up to 8 Si atoms. Preferably, the linking group R" is selected from oxy, hexafluoroisopropylidene, 1-phenyl-2,2,2-trifluoroethylidene, carbonyl, methylene, a covalent carbon to carbon bond, disiloxanylene and polysiloxanylenes, most preferably, carbon to carbon bond, hexafluoroisopropylidene, 1-phenyl-2,2,2-trifluoroethylidene and oxy.

When the moiety R" contains the hexafluoroisopropylidene group or the 1-phenyl-2,2,2-trifluoroethylidene group than R may be selected from:

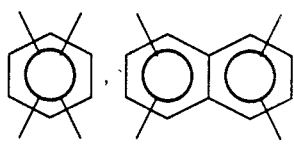

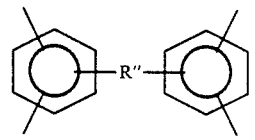

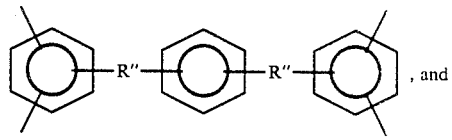

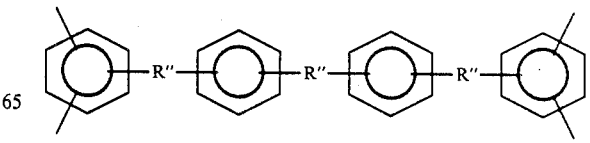

and wherein R" is defined above.

The hydrogen atoms of the groups R, R' and R" may be substituted by non-interferring monovalent substituents such as chloro, fluoro, lower alkyl up to 6 carbons and phenyl. Also as used herein, the term "aromatic" is meant to include heteroaromatics wherein one or more of ring atoms is replaced with —O—, —S—, or —N— atoms.

The polyimides of the invention are prepared from an aromatic diamine and aromatic dianhydride wherein at least one of these components is selected from 2,2-hexafluoro-bis(3,4-dicarboxyphenyl)propane dianhydride; 2,2-hexafluoro-bis(3-aminophenyl)propane; 2,2-hexafluoro-bis(4-aminophenyl)propane; 2,2-hexafluoro-bis[4-(3-aminophenoxy)phenyl]propane; 2,2-hexafluoro-bis[4-(4-aminophenoxy)phenyl]propane; 1,1-bis(4-aminophenyl)-1-phenyl-2,2,2-trifluoroethane; 1,1-bis-(1,2-dicarboxyphenyl)]-1-phenyl-2,2,2-trifluoroethane dianhydride and mixtures thereof.

Illustrative diamine comonomers for the above dianhydrides are:
m-phenylene diamine;
p-phenylene diamine;
4,4'diaminodiphenyl ether;
3,3'-diaminodiphenyl ether;
3,4'-diaminodiphenyl ether;
1,3-bis-(aminophenoxy)benzene (m-APB);
1,4-bis(aminophenoxy)benzene (p-APB); benzidine;
3,3'-dimethyl benzidine;
3,3'-dichloro benzidine;
3,3'-dimethoxy benzidine;
3,3'-dibutoxy benzidine;
3,3'-diaminodiphenyl methane;
4,4'-diaminodiphenyl methane;
4,4'-diaminodiphenyl propane;
3,3'-diaminodiphenyl sulfone;
4,4'-diaminodiphenyl sulfone;
4,4'-diaminodiphenyl sulfide;
α,α'-bis(aminophenyl)p-diisopropylbenzene;
1,3-bis[4(4-aminophenoxy)- α,α'-bistrifluoromethyl]-benzene;
2,2-bis(4-aminophenyl)propane;
m-xylylenediamine;
p-xylylenediamine;
4,4'-bis(p-aminophenoxy)diphenyl sulfide;
4,4'-bis(3"-aminophenoxy)diphenyl sulfide;
4,4'(3"-aminophenoxy-(4'-aminophenoxy)diphenyl sulfide;
4,4'-bis(p-aminophenoxy)diphenyl sulfone;
4,4'-bis-(3"-aminophenyl sulfone;
2,2-bis-[4'-p-aminophenoxy)phenyl]propane;
2,2-bis-[3'p-aminophenoxy)phenyl]propane;
1,1-bis-[4'(p-aminophenoxy)phenyl]ethylbenzene and mixtures thereof.

Preferred diamines are:
p-phenylene diamine;
meta-phenylene diamine;
2,2-bis[4-(4-aminophenoxy)phenyl]hexafluoropropane;
3,4'-diaminodiphenyl ether;
4,4'-diaminodiphenyl ether;
2,2-hexafluoro-bis(3-aminophenyl)propane;
2,2-hexafluoro-bis(4-aminophenyl)propane;
1,1-bis(4-aminophenyl)-1-phenyl-2,2,2-trifluoroethane.

Illustrative dianhydride comonomers are:
2,3,6,7-naphthalene tetracarboxylic dianhydride;
3,3'4,4'-diphenyl tetracarboxylic dianhydride;
1,2,5,6-naphthalene tetracarboxylic dianhydride;
2,2',3,3'-diphenyl tetracarboxylic dianhydride;
2,2-bis(3,4-dicarboxyphenyl)propane dianhydride;
bis(3,4-dicarboxyphenyl)sulfone dianhydride;
3,4,3,10-perylene tetracarboxylic acid dianhydride;
bis(3,4-dicarboxyphenyl)ether dianhydride;
2,2-bis(2,3-dicarboxyphenylpropane dianhydride;
1,1-bis(2,3-dicarboxyphenyl)ethane dianhydride;
bis(3,4-dicarboxyphenyl)methane dianhydride;
bis(2,3-dicarboxyphenylsulfone dianhydride; and
benzophenone tetracarboxylic dianhydride.

Preferably, the dianhydride is selected from:
2,2-hexafluoro-bis(3,4-dicarboxyphenyl)propane dianhydride;
1,1-bis[4-(1,2-dicarboxyphenyl)]1-phenyl-2,2,2-trifluoroethane dianhydride;
3,3',4,4'-diphenyl tetracarboxylic dianhydride;
3,3',4,4'-benzophenone tetracarboxylic dianhydride; and
bis(3,4-dicarboxyphenyl)ether dianhydride.

The photopolymerizable material of the photosensitive composition of the invention comprises an addition polymerizable, non-gaseous (boiling temperature above 100° C. at normal atmospheric pressure), ethylenically-unsaturated compound containing at least two terminal ethylenic groups, and being capable of forming a high molecular weight polymer by free radical initiated, chain propagating addition polymerization. Suitable polymerizable materials non-exclusively include tetraethylene glycol dimethacrylate, ethylene glycol dimethacrylate, trimethylol propane trimethyacrylate, trimethylol propane triacrylate, polyethylene glycol (200) diacrylate, polyethylene glycol (600) diacrylate, diethylene glycol dimethacrylate, pentaerythritol tetraacrylate, pentaerythritol triacrylacrylate, 1,4-butanediol diacrylate, 1,6-hexanediol dimethacrylate, dipentaerythritol monohydroxypentaacrylate, ethoxylated bisphenol A, dimethacrylate, tripropylene glycol diacrylate, tris(2-hydroxyethyl)isocyanurate, trimethylacrylate tris(2-hydroxyethyl)triacrylate, glycerol diacrylate, glyercoltriacrylate, hexamethylene diamine, diacrylamide and mixtures thereof.

Suitable photoinitiators useful in the practice of the invention are disclosed in U.S. Pat. No. 4,464,457; 4,465,758 and 4,619,998 which are incorporated herein by reference. A large number of substances can be used in the mixture of the present invention as polymerization initiators which can be activated by radiation, particularly actinic light. Examples are benzoin and its derivatives, trichloromethyl-s-triazines, 1,3-bistrichloromethyl-5-(para-biphenyl)triazine-2,4,6; 1,3-bistrichloromethyl-5-para-stilbenyl)triazine-2,4,6; 1,3-bistrichloromethyl-5-(4-ethoxy-1-naphthyl)triazine-2,4,6; carbonylmethyleneheterocyclic compounds containing trihalomethyl groups, for example 2-(p-trichloromethylbenzoyl methylene)-3-ethyl benzothiazoline, acridine derivatives, for example, 9-phenylacridine, 9-p-methoxyphenylacridine, 9-acetylaminoacridine and benz(1)acridine. Other examples are phenazine derivatives, for example 9,10-dimethylbenz(a)phenazine and 10-methoxybenz(a)phenazine, quinoxaline derivatives, for example, 6,4',4"-trimethoxy-2,3-diphenylquinoxaline and 4',4"-dimethoxy2,3-diphenyl-5-azaquinoxaline; 2,3-diphenyl-6-methylquinoxaline-1,4; 2,3-diphenyl-6-methoxyquinoxaline-1,4; 2,3-bis(para- methoxyphenyl)-6-methoxyquinoxaline-1,4; 2,3-bis(para-methoxy- phenyl)quinoxaline-1,4 and quinazoline derivatives. The initiators are generally employed in the present invention in an amount of 0.01 to 2, preferably 0.05 to 10% by weight, relative to the non-volatile components of the mixtures.

The mixture according to the present invention generally contains 20 to 90, preferably 30 to 80, % by weight of solvent soluble polyimide and 80 to 10, preferably 70 to 20, % by weight of polmmerizable compounds, relative in each case to the total amount of non volatile ethylenically unsaturated monomer and polyimide components.

The mixture can contain, as further conventional components, polymerization inhibitors, oxygen scavengers, hydrogen donors, sensitometric regulators, dyes, pigments, plasticizers and thermally activatable crosslinking agents.

It is generally advantageous to substantially isolate the compositions of the present invention from the influence of atmospheric oxygen during photopolymerization. If the composition is used in the form of a thin copying layer, it is recommended that a suitable cover film with a low permeability to oxygen be applied to the layer.

Leuco bases of triarylmethane dyes that are suitable for use in the present invention include those of Crystal Violet, Victoria Blue BH, Victoria Pure Blue BOH, Methyl Violet, Fuchsine, Malachite Green, Acid Violet 5B, Solar Cyanine 6B, Brillant Green and Acilan Violet S.

Suitable actinic radiation to which the composition according to the present invention is sensitive is any electromagnetic radiation whose energy is sufficient to initiate polymerization. Visible and ultraviolet light, x-rays and electron radiation are particularly suitable. Laser radiation in the visible and UV range can also be used. Short-wavelength visible and near-UV light is preferred.

The photosensitive compositions of the invention may be employed in solution which can be applied to a substrate by any conventional method; roller coating, dipping, spraying, whirling and spin coating. They may be prepared into and used as dry films as is taught in U.S. Pat. No. 4,469,982 to Celeste which teachings are incorportaed herein by reference.

Suitable substrates include silicon, aluminium, glass polymeric resin boards and films, silicon dioxide, doped silicon dioxide silicon nitride, tantalum, copper, polysilicone ceramics and aluminum/copper mixtures.

Suitable application solvents include toluene, N-methylpyrrolidne, dimethylformamide γ-butyrolactone, acetone, diglyme, tetrahydrofuran, propylene glycol methyl ether and mixtures. The photosensitive composition after exposure may be developed by any suitable organic solvent; e.g., γ-butyrolactone, toluene propylene glycol methyl ether toluene, N-methylpyrrolidone toluene, acetone/water mixtures etc.

The following examples are illustrative of the invention:

EXAMPLE 1

The polyimide condensation product of 2,2-bis(4-aminophenyl)hexafluoropropane and 2,2-bis(3,4-dicarboxyphenyl)hexafluoropropane tetracarboxylic dianhydride was prepared.

A 3-liter, 3-neck flask equipped with a condenser, thermometer, stirrer and nitrogen purge blanket, was charged with 96.86 gms (0.29 moles) 2,2-(bis(4-aminophenyl)hexafluoropropane (Mol. wt. 334) and 510 gms. of distilled N-metyylpyrrolidone solvent under nitrogen atmosphere. The mixture was stirred to obtain a clear solution and to the solution were added 128.76 gms (0.29 moles) of 2,2-bis(3,4-dicarboxyphenyl)hexafluoropropane tetracarboxylic dianhydride (Mol. wt 444). After adding 392 gms of solvent, the reaction mixture is stirred overnight at room temperature. The resulting viscous polyamic acid has inherent viscosity of 0.73 dl/gm measured at 0.5 gm/dl at 25° C. in dimethylacetamide (DMAC). To the 1125 gms polyamic acid solution 290 gms of acetic anhydride and 29 gms of beta-picoline is added to convert the polyamic acid to the polyimide and the resulting polyimide is precipitated in methanol and is isolated by filtration, washed with fresh methanol and dried.

The polymer is soluble in acetone, dimethylacetamide, N-methylpyrrolidone, diglyme, methyl ethyl ketone, tetrahydrofuran, chloroform, butyrolactone, dimethylformamide solvents. A film is prepared from 20% solution in a butyrolactone/diglyme mixture and cured to 350° C. in stepwise heating. An almost colorless, clear, flexible self supporting tough film is obtained. The glass transition temperature of the solid polymer is 320° C. by DSC. The polymer has an inherent viscosity of 0.55 dl/gm at 0.5% polymer concentration at 25° C. in DMAC.

EXAMPLES 2–4

The procedure of Example 1 was used to prepare the polyimides of the following aromatic diamines and dianhydrides:

Ex. 2 - 2,2-hexafluoro-bis(4-aminophenyl)propane and 3,3′,4,4′-benzophenone tetracarboxylic dianhydride;

Ex. 3 - 2,2-hexafluoro-bis(4-aminophenyl)propane and 3,3′,4,4′-diphenyl tetracarboxylic dianhydride;

Ex. 4 - 2,2-hexafluoro-bis(4-aminophenyl)propane and bis(3,4-dicarboxyphenyl)ether dianhydride.

EXAMPLES 5–8

The procedure of Example 1 was repeated using 2,2-hexafluoro-bis(3-aminophenyl)propane as the diamine and the following dianhydries:

Ex 5 - 3,3′,4,4′-benzophenone tetracarboxylic dianhydride;

Ex. 6 - 3,3′,4,4′-diphenyl tetracarboxylic dianhydride;

Ex. 7 - bis(3,4-dicarboxyphenyl)ether dianhydride.

Ex. 8 - 2,2-hexafluoro-bis(3,4-dicarboxyphenyl)propane tetracarboxylic dianhydride.

EXAMPLES 9–12

The procedure of Example 1 may be repeated using 1,1-bis(4-aminophenyl)-1-phenyl-2,2,2-trifluoroethane as the aromatic diamine and the following dianhydrides:

Ex. 9 - 3,3′,4,4′-benzophenone tetracarboxylic dianhydride;

Ex. 10 - 3,3′,4,4′-diphenyl tetracarboxylic dianhydride;

Ex. 11 - bis(3,4-dicarboxyphenyl)ether dianhydride;

Ex. 12 - 2,2-hexafluoro-bis-(3,4-dicarboxyphenyl)propane dianhydride;

Ex. 13 - 1,1-bis[4-(1,2-dicarboxylphenyl)]-1-phenyl2,2,2-trifluoroethane dianhydride;

EXAMPLES 14–17

The procedure of Example 1 was repeated using 1,1-bis-[4-(1,2-dicarboxyphenyl)]-1-phenyl-2,2,2-trifluoroethane dianhydride as the aromatic dianhydride using the following diamines:

Ex. 14 - 2,2-hexafluoro-bis(4-aminophenyl)propane;

Ex. 15 - 2,2-hexafluoro-bis(3-aminophenyl)propane;

Ex. 16 - 1,1-bis(4-aminophenyl)-1-phenyl-2,2,2-trifluoroethane.

Ex. 17 - 2,2-bis[4-(4-aminophenoxy)phenyl]hexafluoropropane.

EXAMPLE 18

The procedure of Example 17 may be repeated using the following diamine and the dianhydride of Example 17.

Ex. 18 - 2,2-bis[4-(3-aminophenoxy)phenyl]hexafluoropropane.

EXAMPLES 19–21

The procedure of Example 1 was repeated using 2,2-hexafluoro-[4-(4-aminophenoxy)phenyl]propane as the diamine component with the following dianhydride components:

Ex. 19 - 3,3',4,4'-diphenyl tetracarboxylic dianhydride;
Ex. 20 - bis(3,4-dicarboxyphenyl)ether dianhydride;
Ex. 21 - 2,2-hexafluoro-bis-(3,4-dicarboxyphenyl)propane dianhydride.

These polyimides were solvent soluble and exhibited good film forming characteristrics.

EXAMPLES 22–24

The procedure of Example 1 may be repeated using 2,2-hexafluoro-[4-(3-aminophenoxy)pheny]propane as the diamine component with the following dianhydrides:

Ex. 22 - 3,3',4,4'-diphenyl tetracarboxylic dianhydride;
Ex. 23 - bis(3,4-dicarboxyphenyl)ether dianhydride;
Ex. 24 - 2,2-hexafluoro-bis-(3,4-dicarboxyphenyl)propane dianhydride.

The polyimides of Ex. 1–24 may be employed to provide the photosensitive compositions of the invention. They are soluble in common industrial solvents and they exhibit good compatibility with the other components of the formulation. However, after formulation into the photosensitive compositions of the invention, application to a substrate, imagewise exposure they become insoluble and development can be accomplished using a suitable solvent. They may then be heated to about 250°–350° C. for about an hour to volatilize the crosslinked photopolymerized polymeric acrylate component. In the electronic semiconductor field, these photosensitive compositions have applications as α-particle barriers, passivation and protection layers, micro solder stop masks, interlayer dielectrics, metal lift off masks, ion implant masks and ion etch masks. The following examples illustrate the photo processing of the compositions of the invention.

EXAMPLE 25

A photosensitive composition was prepared using the solvent soluble polyimide of Example 1. The composition consisted of the following:
Example 1 Polyimide—4.0 grams
Pentaerythritol triacrylate—1.5 grams
1,3-bistrichloromethyl-5(p-stilbenyl)triazine-2,4,6—0.1 gram
Dye—0.03 gram
Diglyme/Butyrolactone (50/50)—16.0 grams The above ingredients dissolved to form clear solution with the polyimide exhibiting excellent compatibility with the other components in the composition.

The resulting photosensitive composition was filtered under pressure and roller coated on an anodized aluminum plate. The coated plate was pre-baked at 90° C. for 3 minutes to obtain a resist film having thickness of 4–5 microns. The film was then overcoated with polyvinyl alcohol protective layer (10% in water) pre-baked at 90° C. for 2 minutes. The film was then covered with a photomask having a striped pattern so that the film and the photomask were in tight contact. The film was exposed through an Addalux vacuum printer (2 KW, photopolymer lamp/UV broad band radiation). The irradiation time range was 300 sec. After the irradiation, the coating was first rinsed with hot water to remove the polyvinyl alcohol overcoat, then was developed with a mixed solution of 4 volume of γ-butyrolactone and 1 volume of toluene and rinsed with n-hexane to give a negative image having a line and space pattern having a minimum line width of 4 microns. The pattern thus obtained is thermally stable at 300° C. and no blurring was noticed on heating the plate at 300° C./1hr.

Other developers include a mixture of toluene/n-methylpyrrolidone (9:1) and acetone/water (7:3).

EXAMPLE 26

A photosensitive composition was prepared in accordance with the procedure of Example 25 using the polyimide of Ex. 8 and an exposure time of 200 seconds.
Example 8 Polyimide—2.0 grams
Diglyme—7.5 grams
Butyrolactone—7.5 grams
Pentaerythritol triacrylate—0.4 gram
Photoinitiator (same as Example 25)—0.03 gram
The image produced was of excellent quality and equal to that of Example 25.

EXAMPLE 27

The procedure of Example 25 was repeated using the polyimide of Example 4 and exposure time of 200 second. The formulation amounts were the same as in Example 26. The developer was a 95/5 (volume ratio) of toluene and N-methylpyrrolidone using a hexane rinse. The developed photosensitive composition produced an image equal to those in Examples 25 and 26.

EXAMPLE 28

A dry photosensitive film was prepared using the polyimide of Example 1. A photosensitive composition comprising the following ingredients was prepared:
Example 1 Polyimide—4.0 grams
Diglyme—8.0 grams
Butyrolactone—8.0 grams
Pentaerythritol triacrylate—1.5 grams
Photoinitiator (same as Example 25)—0.1 gram
Dye—0.03 gram The resulting solution was filtered under pressure. The solution thus obtained was roller coated on Mylar polyester film; the coated film was pre-baked at 90° C. for 3 minutes to obtain a coating on the Mylar film having thickness of 4–5 microns. The film was then laminated on an anodized aluminum plate. The film was then covered with a photomask having a striped pattern so that the film and the photomask were in tight contact. The film was exposed through an Addalux vacuum printer (2 KW, photopolymer lamp, UV-broad band radiation) for 200 seconds. After the irradiation, the Mylar film was peeled-off and the exposed, coated plate was developed with a toluene/N-methylpyrrolidone (95/5) solution, rinsed with n-hexane to give a negative image having a line and space pattern having a minimum line width of 4 microns. The pattern thus obtained show no blurring or loss of resolution and heating up to 300° C.

EXAMPLE 29

Example 1 Polyimide—1.5 gm
2,2-hexafluoro-bis(4-hydroxyphenyl)propane diacrylate
(6F bisphenol diacrylate)—0.5 gm
Photoinitiator—same as Example 25—0.1 gm
Red dye—0.03 gm
Diglyme—7.5 gm
γ-Butyrolactone—7.5 gm The above ingredients were dissolved to form clear solution with the polyimide exhibiting excellent compatibility with the other components of the composition.

The resulting photosensitive composition was filtered under pressure and roller coated on an anodized aluminum plate. The coated plate was pre-baked at 90° C. for 3 minutes to obtain a resist film having a thickness of 4-5 microns. The film was then overcoated with a polyvinyl alcohol protective layer (10% in water) and pre-baked at 90° C. for 2 minutes and then covered with a photomask having a pattern so that the film and the photomask were in tight contact. The film was exposed on an Addalux vacuum printer (2 KW, photopolymer lamp/UV radiation/broad band exposure) for an irradiation time range of 300 sec. After the irradiation, the coating was first rinsed with hot water to remove the polyvinyl alcohol overcoat. It was then developed with a solvent mixture of toluene:N-methylpyrrolidone (95/5), rinsed with n-hexane to give a negative image having a line and space pattern having a minimum line width of 4 microns. The pattern thus obtained is thermally stable above 300° C. No blurring was noticed on heating the plate to 300° C. for one hour.

6F-bisphenol diacrylate provides a high temperature resistant photoresist formulation having the superior compatibility with the fluorinated matrix polymer of the invention.

Although the solvent soluble polyimides of the compositions of the invention have particular utility in photosensitive compositions, certain of them exhibit additional surprisingly superior mechanical and thermal properties which render them particularly suited as interlayers per se in semiconductor devices for example as interlayer delectrics in VSLI high speed bipolar circuits. The polyimides of Example 1 and Example 8 have a dielectric constant less than 3; i.e. 2.4 to 2.6 as measured on a Hewlett Packard Automated Network Analyzer over a frequency range of 8-12 GHz at ambient temperature. The polyimides of the invention e.g. Example 2 and Example 4 exhibit outstanding elongation properties of approximately 15 and 23 percent respectively with outstanding thermal properties e.g. Example 3 has a glass transition temperature of 346° C. These polyimides per se may be used a dielectric layers and packaging coatings for bonded chips and their high thermal stability and high elongation properties minimizes the possibility of rupturing wire connections caused by thermal stresses encountered in manufacturing processes. The photosensitive compositions of the invention may be employed in embedded conductor devices; for example as described in U.S. Pat. No. 4,650,545, which is incorporated herein by reference.

The photosensitive polyimide compositions of the invention may be compounded with organic or inorganic fillers such as silica, graphite, PTFE or molybdenum, fibers such as carbon, boron and glass or used as laminating varnishes in the preparation of quartz, glass, boron and graphite fabric laminates. In addition they may be filled with conductive metal fillers such as gold or silver and used in microelectronic devices to produce conductive circuitry patterns. Typical applications of laminates and composites utilizing the photosensitive polyimide composition of the invention are turbine blades, aerospace structural components or printed circuit boards. Since no aqueous volatiles are evolved in the final curing of these photosensitive polyimides, the formation of strength reducing voids is reduced or eliminated. The composite or laminate structure may be heated to remove the carrier solvent, flood exposed with actinic radiation to initiate polymerization and then optionally thermal cured under pressure to form a high strength part or the part may be simply thermally cured after removal of the carrier solvent.

In addition, certain of the polyimide components of the invention exhibit outstanding physical properties which makes them particularly useful in the preparation of laminates and composites per se; see, for example, the polyimides of Examples 2 and 4 which exhibit high elongation and high thermal stability and the polyimide of Example 3 which has a glass transition temperature of 346° C.

In addition, we have found that certain of the polyimide components of the invention can be thermally or melt fabricated under heat and pressure which renders these polyimides particularly useful in the preparation of shaped articles such as molded parts, laminates and composites. These polyimides are the condensation reaction products of:

(1) 2,2-hexafluoro-bis(3,4-dicarboxyphenyl)propane dianhydride and 2,2-hexafluoro-bis-(3-aminophenyl)-propane (Tg-254° C.);

(2) 2,2-hexafluoro-bis(3,4-dicarboxyphenyl)propane dianhydride and 2,2-hexafluoro-bis-(4-aminophenyl)-propane (Tg - 324° C.);

(3) 3,3',4,4'-diphenyl tetracarboxylic dianhydride and 2,2-hexafluoro-bis(3-aminophenyl)propane (Tg - 260° C.)

(4) 3,3',4,4'-diphenyl tetracarboxylic dianhydride and 2,2-hexafluoro-bis(4-aminophenyl)propane (Tg - 346° C.);

(5) 3,3',4,4'-benzophenone tetracarboxylic dianhydride and 2,2-hexaflouro-bis(3-aminophenyl)propane (Tg - 232° C.);

(6) 3,3',4,4-benzophenone tetracarboxylic dianhydride and 2,2-hexafluoro-bis(4-aminophenyl)propane (Tg - 311° C.);

(7) bis(3,4-dicarboxyphenyl)ether dianhydride and 2,2-hexafluoro-bis(3-aminophenyl)propane (Tg - 231° C.);

(8) bis(3,4-dicarboxyphenyl)ether dianhydride and 2,2-hexafluoro-bis(4-aminophenyl)propane (Tg - 312° C.).

The above specified polyimides may be thermally or melt fabricated into shaped articles e.g. molded parts, fibers, films, laminates and composites using standard techniques. Surprisingly, they may be compression mold at a temperature about or below their glass transition temperature (220°-300° C.) at 3,000 to 5,000 psi. Injection molding or extrusion of polyimides of the present invention may be preferably done with end capped polymers using phthalic anhydride to effect the capping and dried to less than about 0.02% by weight moisture. Molding conditions and process variables preferably are controlled to minimize the thermal history of the polyimide prior to its introduction into the mold cavity. The thermal heat history may be minimized by the use of a two stage injection system. In the first stage, the polyimide is pre-heated to a temperature about 50°-100° C. below the melt flow temperature using a plasticating screw. A predetermined amount of the pre-heated polymer is transferred to a second injection stage, heated to the melt temperature and injeced by means of a plunger into the mold cavity. Two stage injection, molding and single stage injection molding techniques are well known in the art; see, e.g. Operator's Handbook for Plastic Injection Molding, Society of Plastic Industries Inc., 1987, Washington, D.C. and Modern Plastics Enc., Injection Molding, p. 258-274, 1984-1985 Ed. McGraw-Hill, which are incorporated herein by reference. Illustrative operating conditions are plasticating temperatures 175°-250° C., 300°-410° C. injection barrel temperature, screw speed 150 RPM, and mold temperature - 150°-225° C. Advantageously fillers such as glass fibers, silica, molybdenum, graphite, and PTFE may be compounded or blended with the above specified polyimides to form injection molding compounds.

In the preparation of laminates, a laminating varnish may be prepared by dissolving the above specified polyimides in a suitable solvent such as N-methylpyrrolidone, diglyme, dimethylformamide, propyl glycol methyl ether, etc. The polyimide varnish solution is then applied to a suitable reinforcing fabric such as a boron fiber fabric, a quartz fiber fabric, graphite or glass fabric and the solvent removed and a fused shaped part is formed using vacuum bag or autoclave laminating procedures. Similarly, these polyimides may be processed into fibers by melt or solution techniques and knitted or braided into a fabric or structural form which is then laminated with a reinforcing fabric of glass, boron, quartz or graphite, optionally with a laminating varnish, under heat and pressure. Similarly, glass, quartz, boron and graphite fibers may be mixed with a solution of these polyimides, the solvent removed by heat and optionally reduced pressure and the mixture fused into an article of the desired shape by the use of heat and pressure.

Another application of the photosensitive compositions of the invention is the manufacture of liquid crystal display devices (LCD's) wherein the compositions of the invention provide orientation layers. In the preparation of liquid crystal displays, it is necessary to bond the mating glass substrates and some method of removing the orientation layers from the peripheral seal areas must be employed or the seal area is kept clean by using a template or structured device in the application of the orientation layer material; in either method the peripheral seal area is kept clean to effectively bond the mating glass substrates.

LCD orientation layers of polyimides have been prepared in the past from a solution of a polyamic acid (polyamidocarboxylic acid) in a solvent which is applied to the electrode base layer or to the electrode based plate. After application, the solvent is evaporated and the coated substrate is heated to about 250° C., whereby the polyimide is formed. The polyimide layer is then given an orientation treatement to align the polyimide molecules. Orientation is effected by brushing or rubbing the film in one direction; see, for example, U.S. Pat. No. 4,068,923, which describes the orientation technique.

The advantages of using the fully imidized photosensitive compositions of the invention in preparing LCD devices are many which will become apparent from the following description: The base layer or plate is coated with the composition of the invention dissolved in a suitable solvent using any conventional technique, e.g. roller, brush, spin or spray coating. The solvent is then removed at low temperatures (75°-90° C.), optionally using reduced pressure. The coated substrate is then imagewise exposed to actinic radiation using a mask or template to protect the peripheral seal areas of the substrate and then developed in a suitable developer solvent to remove the unexposed coating from the peripheral seal areas, rinsed and dried. The coated and patterned substrate is then subjected to an orientation treatment and adhesively bonded at the peripheral seal areas to a mating substrate that has been coated, patterned and oriented in a similar manner. Any suitable adhesive may be used to join the coated electrode base plates; for example, an epoxy adhesive, a polyurethane adhesive, a low melting glass solder or polymeric solder.

The photosensitive compositions of the invention eliminate the high temperature imidization step of the past, the sealing surface areas of the electrode base plates are clean and can be effectively joined by simple glueing or soldering techniques and the hexafluoroisopropylidene polyimide layer is highly transparent up to a thickness of one micron or greater. The preparation of liquid crystal displays is well known and is described in various publications; see, for example, U.S. Pat. No. 4,619,500; British Patent No. 1,372,868, which are incorporated by reference.

The advantages of the polyimide photosensitive compositions of the invention will be apparent to one skilled in the art; for instance, in addition to the foregoing advantages, the polyimide compositions of the invention do not evolve water during processing in microelectronic devices which does occur in the current state of the art polyamic acid compositions. In addition the polyimide compositions of the invention are substantially more storage stable than the polyamic acid compositions of the art.

The invention has been described by way of the above specification and illustrative examples and it is to be understood that this invention is not limited to the specific embodiments thereof except as defined by the following claims:

We claim:

1. A photosensitive polyimide composition consisting essentially of solvent soluble polyimide which is the condensation product of an aromatic diamine and an aromatic dianhydride; a photoinitiator; a photopolymerizable compound containing at least two terminal ethylenically unsaturated groups; wherein at least one of said dianhydride or said diamine is selected from 2,2-hexafluoro-bis(3,4-dicarboxyphenyl)propane dianhydride; 2,2-hexafluorobis(3-aminophenyl)propane; 2,2-hexafluoro-bis(4-aminophenyl)propane; 2,2-hexafluoro-bis[4-(3-aminophenoxy)phenyl]propane; 2,2-hexafluoro-bis[4-(4-aminophenoxy)phenyl]propane; 1,1-bis(4-aminophenyl)-1-phenyl-2,2-2-trifluoroethane; 1,1-bis-[4-(1,2-dicarboxyphenyl)]-1-phenyl2,2,2-trifluoroethane dianhydride and mixtures thereof.

2. A composition according to claim 1 wherein said dianhydride is 2,2-hexafluoro-bis(3,4-dicarboxyphenyl)-propane dianhydride and diamine is selected from 2,2-hexafluorobis(4-aminophenyl)propane; 2,2-hexafluoro-bis(3-aminophenyl)propane; 2,2-hexafluoro-bis[4-(3-aminophenoxy)phenyl]propane; 2,2-hexafluoro-bis[4-(4-aminophenoxy)phenyl]propane and mixtures thereof.

3. A composition according to claim 1 wherein said diamine is 2,2-hexafluoro-bis(3-aminophenyl)propane and said dianhydride is selected from 3,3',4,4'-benzophenone tetracarboxylic dianhydride; bis(3,4-dicarboxyphenyl)ether tetracarboxylic dianhydride; 3,3',4,4'-diphenyl tetracarboxylic dianhydride and mixtures thereof.

4. A composition according to claim 1 wherein said diamine is 2,2-hexafluoro-bis(4-aminophenyl)propane and said dianhydride is selected from 3,3',4,4'-benzophenone tetracarboxylic dianhydride; bis(3,4-dicarboxyphenyl)ether tetracarboxylic dianhydride; 3,3',4,4'-diphenyl tetracarboxylic dianhydride and mixtures thereof.

5. A composition according to claim 1 wherein said diamine is selected from 2,2-hexafluoro-bis[4-(3-aminophenoxy)phenyl]propane and said dianhydride is selected from bis(3,4-dicarboxyphenyl)ether tetracarboxylic dianhydride; 3,3',4,4'-diphenyl tetracarboxylic dianhydride and mixtures thereof.

6. A composition according to claim 1 wherein said diamine is selected from 2,2-hexafluoro-bis[4-(4-aminophenoxy)phenyl]propane and said dianhydride is selected from bis(3,4-dicarboxyphenyl)ether tetracarboxylic dianhydride; 3,3',4,4'-diphenyl tetracarboxylic dianhydride and mixtures thereof.

7. A composition according to claim 1 wherein said dianhydride is selected from 1,1-bis[4-(1,2-dicarboxyphenyl)]-1-phenyl-2,2,2-trifluoroethane and said diamine is selected from 2,2-hexafluoro-bis(4-aminophenyl)propane; 2,2-hexafluorobis(3-aminophenyl)propane; 2,2-hexafluoro-bis[4-(3-aminophenoxy)phenyl]propane; 2,2-hexafluoro-bis[4-(4-aminophenoxy)phenyl]propane; 1,1-bis(4-aminophenyl)-1-phenyl-2,2,2-trifluoroethane and mixtures thereof.

8. A composition according to claim 1 wherein said diamine is 1,1-bis(4-aminophenyl)-1-phenyl-2,2,2-trifluoroethane and said dianhydride is selected from 2,2-hexafluoro-bis-(3,4-dicarboxyphenyl propane dianhydride.

9. A microelectronic circuit coated with a photosensitive polyimide composition according to claim 1.

10. A microelectronic circuit coated with a photosensitive polyimide composition according to claim 2.

11. A microelectronic circuit coated with a photosensitive polyimide composition according to claim 3.

12. A microelectronic circuit coated with a photosensitive polyimide composition according to claim 4.

13. A microelectronic circuit coated with a photosensitive polyimide composition according to claim 5.

14. A microelectronic circuit coated with a photosensitive polyimide composition according to claim 6.

15. A microelectronic circuit coated with a photosensitive polyimide composition according to claim 7.

16. A microelectronic circuit coated with a photosensitive polyimide composition according to claim 8.

* * * * *